United States Patent
Midya (10) Patent No.: US 7,649,961 B2
(45) Date of Patent: Jan. 19, 2010

(54) SUPPRESSED CARRIER QUADRATURE PULSE MODULATOR

(75) Inventor: Pallab Midya, Palatine, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 604 days.

(21) Appl. No.: 11/156,396

(22) Filed: Jun. 20, 2005

(65) Prior Publication Data

US 2007/0002943 A1 Jan. 4, 2007

(51) Int. Cl.
  *H03D 1/24* (2006.01)
(52) U.S. Cl. .......... 375/321; 375/296; 375/297; 375/284; 375/254; 375/367
(58) Field of Classification Search ........... 375/321, 375/296, 297, 284, 254, 367
See application file for complete search history.

(56) References Cited

U.S. PATENT DOCUMENTS

| | | | |
|---|---|---|---|
| 4,112,368 A * | 9/1978 | Ewanus et al. ............... | 375/130 |
| 6,614,323 B2 | 9/2003 | Wagh et al. | |
| 7,095,796 B1 * | 8/2006 | May et al. .................... | 375/295 |
| 2004/0169553 A1 * | 9/2004 | Maejima ..................... | 330/10 |
| 2005/0033168 A1 * | 2/2005 | Shifrin ....................... | 600/437 |
| 2006/0093064 A1 | 5/2006 | Cui | |
| 2006/0158359 A1 * | 7/2006 | Magrath ..................... | 341/143 |

* cited by examiner

*Primary Examiner*—Shuwang Liu
*Assistant Examiner*—Kabir A Timory
(74) *Attorney, Agent, or Firm*—Brinks, Hofer, Gilson & Lione (57) ABSTRACT

A digital amplifier and method are provided to convert digital base-band signals to a pair of digital switching waveforms switching at a carrier frequency to create a modulated RF signal. The digital amplifier contains variable frequency suppressed carrier PWM generators that produce in-phase and quadrature-phase differential signals, a mixer that combines the differential signals, a decoder that decodes the combined signals, and a power stage that receives signals from the decoder and provides an amplified signal at the carrier frequency using switches. The mixer combines the differential signals such that only one of the differential signals is output in a period. The carrier generators have integral noise shaping and use a random period signal to re-distribute quantization noise to a band outside an RF band of interest and reduce EMI of the RF signal.

23 Claims, 10 Drawing Sheets

*FIG. 13*

SUPPRESSED CARRIER QUADRATURE PULSE MODULATOR

TECHNICAL FIELD

The present application relates to an apparatus and method of providing modulation signals. More specifically, the present application relates to an apparatus and method of providing modulation signals in which carrier signals are suppressed.

BACKGROUND

The variety and use of electronic devices, especially portable electronic devices such as cellular telephones, laptop computers, and personal digital assistants (PDAs), has dramatically increased in recent years. Many electronic devices, in addition, communicate with other electronic devices. For example, cellular telephones use base stations to rout and amplify data transmission. When designing electronic devices involved in communication, various considerations are taken into account.

One such consideration is power consumption. In most communication applications, signals are provided to a power amplifier used to amplify the signals before supplying the signals to a load. The data is modulated and up-converted from base-band (DC) into a higher, radio frequency (RF) signal. The up-converted signal is then amplified and transmitted to a desired location where the RF signal is received, and down-converted to the original signal in a receiver.

In digital applications, the data supplied to the power amplifier are square wave signals. Square wave signals are more power efficient than analog signals. Unfortunately, when modulating the signals to produce the square wave signals in the frequency band of interest, large signals (tones) are created that are outside the frequency band of interest. Generating and amplifying these tones consumes excess power. Moreover, as the amplified signal is supplied to a bandpass filter, these tones can cause destructive resonance to occur at the power amplifier and may result in a larger, sharper and more complicated-bandpass filter to be used in the device. These problems become more pronounced as the amplification increases. Reducing the tones consequently reduces the power consumed as well as permits a smaller and cheaper bandpass filter to be used.

DETAILED DESCRIPTION OF THE EMBODIMENTS

A digital amplifier and method are provided to convert digital base-band signals to a pair of digital switching waveforms switching at a carrier frequency to create a modulated radio frequency (RF) signal. The modulated RF signal can be efficiently amplified using an RF switching power stage. Previous designs use a switching signal that has large tones outside the frequency band of interest surrounding the carrier frequency. Generating these tones consumes power and, in some cases, can cause destructive resonance at the power stage. This becomes increasingly important as the amplification increases. For example, the tones become more problematic at power levels used in base stations, which transmit at about 100 W, than in cellular telephones, which transmit at about 100 mW. As base stations are about 10% efficient, i.e. to transmit at 100 W, 1 kW is used, a decrease in the generated tones may translate to a significant decrease in power consumed.

Figure 1:
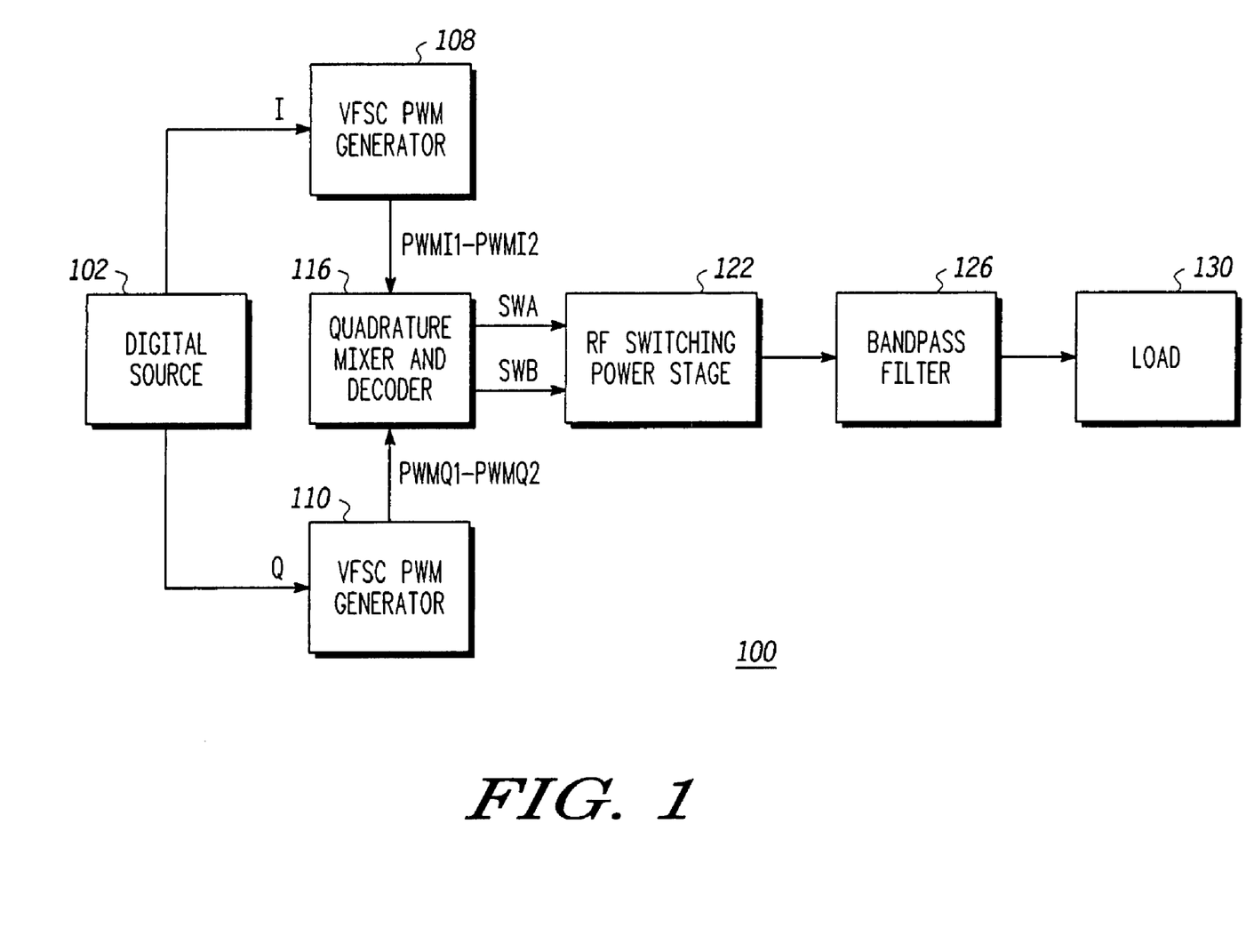
FIG. 1 illustrates a digital amplifier in accordance with one embodiment.

FIG. 1 illustrates digital amplifier 100 in accordance with one embodiment of the present invention. Digital amplifier 100 includes a digital source 102, a pair of variable frequency signal carrier pulse width modulation (VFSC PWM) generators 108, 110, a Quadrature Mixer and Decoder (QMD) 116, an RF switching power stage 122, a bandpass filter 126, and a load 130. The digital source 102 may include such devices as a cell phone or base station. In one embodiment, load 130 may be a transmitter. Other embodiments of the present invention may use other types of loads.

In operation, the digital source 102 provides quadrature modulated digital signals to the VFSC PWM generators 108, 110. More specifically, the digital source 102 provides in-phase signals (I) to one VFSC PWM generator 108 and the quadrature phase signals (Q) to the other VFSC PWM generator 110. Each VFSC PWM generators 108, 110 receives digital signal and uses a random period generator to reduce electromagnetic interference (EMI) and integral noise shaping to reduce the amount of quantization noise caused by quantization. VFSC PWM generators 108, 110 provide in-phase and quadrature phase digital PWM signals pwmI1-pwmI2, pwmQ1-pwmQ2 to QMD 116. The QMD 116 combines the in-phase and quadrature phase digital PWM signals pwmI1-I2, pwmQ1-Q2 and decodes these signals to provide a pair of switching signals SwA, SwB. The switching signals SwA, SwB are then supplied to an RF switching power stage 122 for amplification. Power stage 122 amplifies switching signals SwA, SwB and provides the amplified signals as output to load 130 through a bandpass filter 126 to provide a filtered amplified signal.

Figure 2:
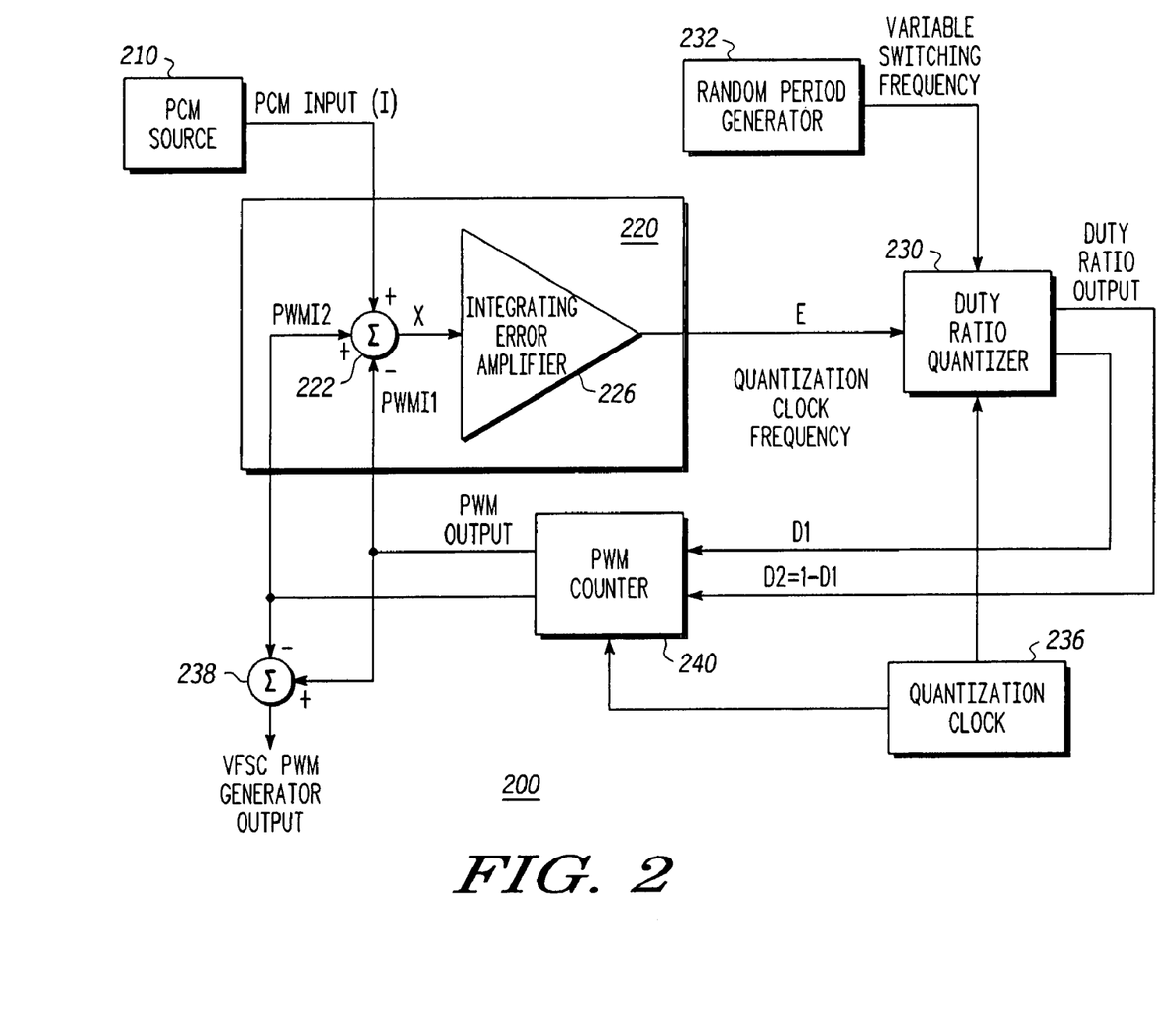
FIG. 2 illustrates a variable frequency suppressed carrier pulse width modulation generator in accordance with one embodiment.

FIG. 2 illustrates one of the VFSC PWM generators 108, 110 (shown as 200 in FIG. 2) in accordance with one embodiment of the present invention. Each VFSC PWM generator 200 includes a noise shaping unit 220, a duty ratio quantizer 230, random period generator 232, quantization clock 236, output summation unit 238, and a pulse width modulation (PWM) counter 240. Noise shaping unit 220 includes summation unit 222 and integrating error amplifier 226.

In operation, VFSC PWM generator 200 receives one of the digital signals from the digital source 102 (referred to as pulse code modulation (PCM) input signal (I) from digital source 210 in FIG. 2). PCM input signal (I) is provided to summation unit 222. Although the digital signal may be either the in-phase signal or the quadrature-phase signal, only the VFSC PWM generator receiving the in-phase signal is shown for convenience.

Summation unit 222 receives PCM input signal (I), PWM output signal pwmI1 and PWM output signal pwmI2. Summation unit 222 performs a summation operation to generate summation signal 224. More specifically, summation signal 224 is the addition of PCM input signal (I) and the difference between PWM output signal pwmI1 and PWM output signal pwmI2. The summation signal 224 is provided to integrating error amplifier 226.

Integrating error amplifier 226 receives summation signal 224 from summation unit 222. Integrating error amplifier 226 performs a series of noise shaping operations to generate error signal E. Error signal E represents the noise shaped error between PCM input signal (I) and the PWM signal difference (i.e., the difference between PWM signal pwmI1 and PWM signal pwmI2). As shown, the duty ratios corresponding to duty ratio D1 and duty ratio D2 may be derived by integrating error amplifier 226 using PWM signal pwmI1 and PWM signal pwmI2. In an alternate embodiment, duty ratio D1 and duty ratio D2 may be provided directly to integrating error amplifier 226 (not shown).

Error signal E is provided to duty ratio quantizer 230. A random period generator 232 provides variable frequency signal VFS for switching (also known as a random period signal), which may vary on a cycle-by-cycle basis, to duty ratio quantizer 230. One exemplary implementation of a random period generator is shown in U.S. application Ser. No. 10/845,949, filed on May 14, 2004, herein incorporated by reference. For example, the total number of available pulses of the duty ratio of one cycle may be 7, then may be 8 in the next cycle, then may be 5 in the next cycle, etc . . . . In an example, the total number of available pulses of the duty ratio varies from 4 to 16. Similarly, quantization clock 236 provides quantization clock signal CLK to duty ratio quantizer 230. Quantization clock signal CLK has a higher frequency than the period determined by variable frequency signal VFS being, for example, at least four times the maximum frequency of variable frequency signal VFS. Duty ratio quantizer 230 receives error signal E, variable frequency signal VFS, and quantization clock signal CLK and generates two different duty ratios: duty ratio D1 and duty ratio D2, which are dependent on the modulated data PCM input signal (I) provided from PCM source 210.

In one embodiment, the quantization noise caused by, for example, duty ratio quantizer 230 is re-distributed by noise shaping unit 220 outside of the band of interest such that a desired signal-to-noise ratio criteria is met at the output of RF switching power stage 122.

Each duty ratio D1, D2 is a series of pulses that is received from duty ratio quantizer 230 and counted by PWM counter 240. PWM counter 240 also receives quantization clock signal CLK from quantization clock 236 and generates PWM output signal pwmI1 and PWM output signal pwmI2 using multiples of the quantization clock signal CLK. The period of the PWM output signals pwmI1, pwmI2 is the carrier frequency. In one embodiment, PWM output signal pwmI1 has a duty cycle that is generated by counting the number of quantization clock signals CLK represented by duty ratio D1 and PWM output signal pwmI2 has a duty cycle that is generated by counting the number of quantization clock signals CLK represented by duty ratio D2. Duty ratio D2 is the complement of duty ratio D1, that is duty ratio D2=1—duty ratio D1. Thus, for example, as shown in FIG. 6 if duty ratio quantizer 240 provides duty ratio D1 of ⅜, it also provides duty ratio D2 of ⅝, where the denominator is the number of quantization clock signals CLK in each period.

PWM counter 240 generates PWM output signal pwmI1 and PWM output signal pwmI2. Both PWM output signal pwmI1 and PWM output signal pwmI2 are square waves. Thus, in the above example, PWM output signal pwmI1 has a pulse width of ⅜ of the width of one period, while PWM output signal pwmI2 has a pulse width of ⅝ of the width of one period, as shown in FIG. 6. Also as shown, PWM output signal pwmI1 and PWM output signal pwmI2 each start at the beginning of each period. PWM output signal pwmI1 and PWM output signal pwmI2 provided to summation unit 222. PWM output signal pwmI1 and PWM output signal pwmI2 are also supplied to output summation unit 238, which generates the difference between PWM output signal pwmI1 and PWM output signal pwmI2 as difference signal pwmI1-pwmI2.

Figure 6:
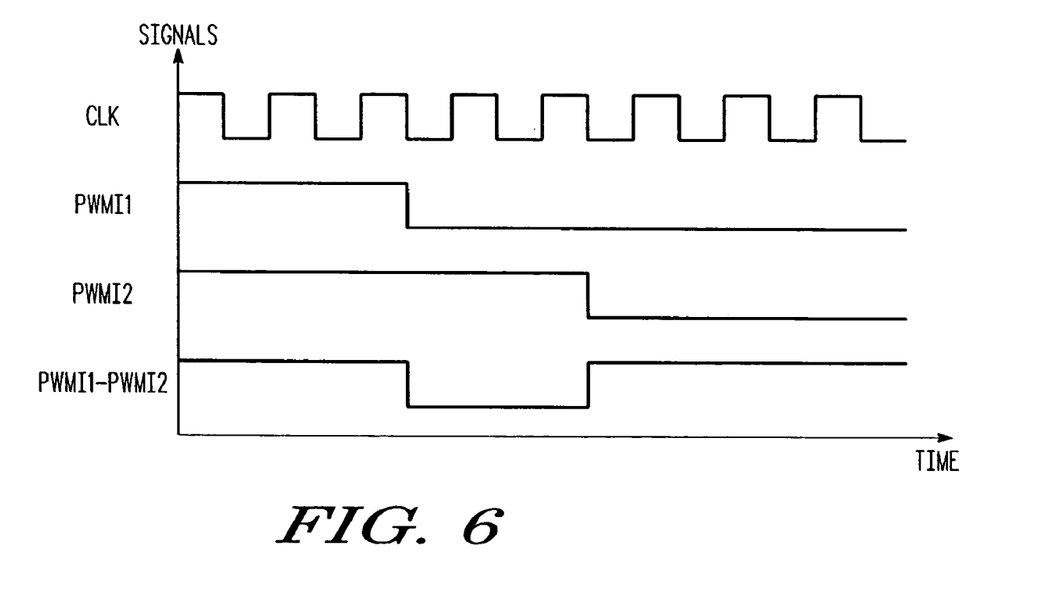
FIG. 6 is an example of various signals during one period in the variable frequency signal carrier pulse width modulation generator.

As is readily apparent in FIG. 6, difference signal pwmI1-pwmI2 may take values of +1, 0, or −1 dependent on the duty ratios D1, D2 supplied to duty ratio quantizer 230. Accordingly, if PCM Input (I) is 0 (i.e. no modulation), then duty ratio quantizer 230 produces duty ratios D1, D2 which are equal. Consequently, the pulse width of each PWM output signal pwmI1, pwmI2 is 50% of the period and difference signal pwmI1-pwmI2=0 for the entire period.

Figure 3:
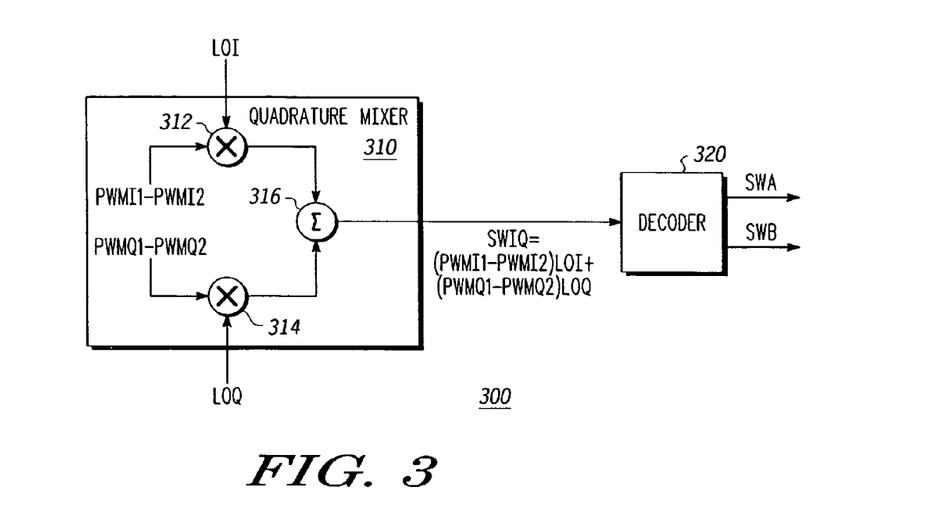
FIG. 3 illustrates a quadrature mixer and decoder in accordance with one embodiment.

The difference signals from each VFSC PWM 108, 110 are supplied to QMD 116 as shown in FIG. 1. As illustrated in FIG. 3, QMD 116 (labeled QMD 300 in FIG. 3) contains quadrature mixer 310 and decoder 320. Quadrature mixer 310 contains multipliers 312, 314 and summation unit 316. In operation, the in-phase difference signal pwmI1-pwmI2 from the in-phase VFSC PWM 108 is supplied to one input of quadrature mixer 310 while the quadrature-phase difference signal pwmQ1-pwmQ2 from the quadrature-phase VFSC PWM 110 is supplied to another input of quadrature mixer 310. Variable frequency signal VFS for switching and quantization clock signal CLK are the same in each VFSC PWM generator each cycle, so that the signals supplied to quadrature mixer 310 have the same period each cycle.

Figure 8:
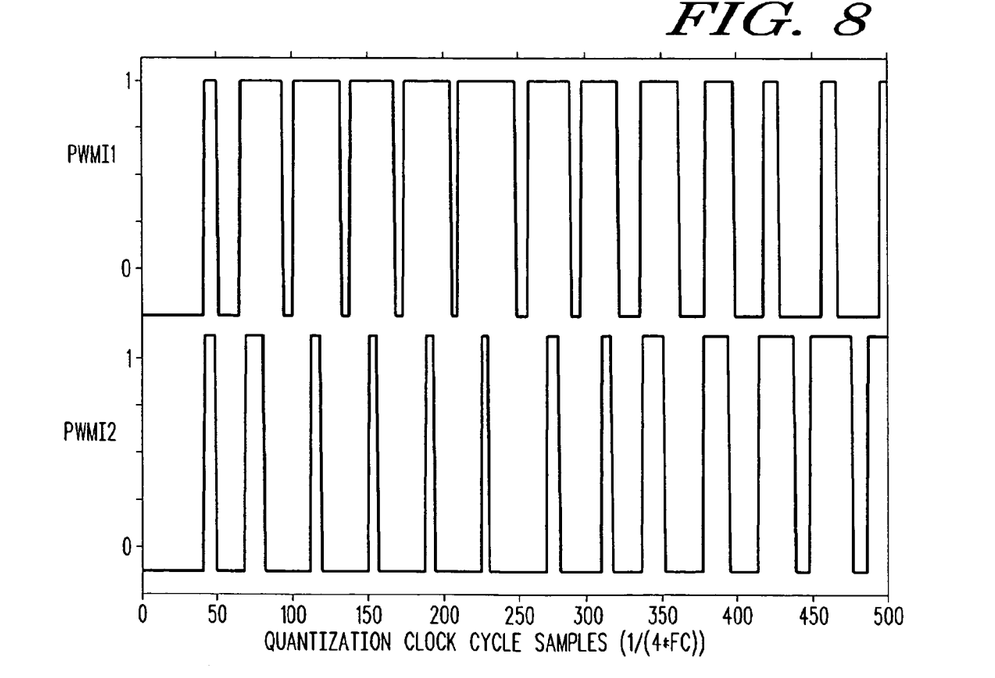
FIG. 8 is an example of PWM outputs in the VFSC PWM generator based on the signals of FIG. 7.

In quadrature mixer 310, in-phase difference signal pwmI1-pwmI2 and in-phase multiplier signal LOI are multiplied by multiplier 312. Correspondingly, the quadrature-phase difference signal pwmQ1-pwmQ2 and quadrature-phase multiplier signal LOQ are multiplied by multiplier 314. In-phase multiplied signal (pwmI1-pwmI2) LOI and quadrature-phase multiplied signal (pwmQ1-pwmQ2) LOQ are summed by summation unit 316 to produced combined switching signal swIQ. Combined switching signal swIQ is then supplied to decoder 320, which decodes combined switching signal swIQ to produce switching signals swA, swB. Switching signals swA, swB are supplied to switching power stage 122, as shown in FIG. 1. FIG. 8 illustrates one example of difference signal pwmI1-pwmI2 and difference signal pwmQ1-pwmQ2, as well as switching signal swIQ.

In-phase multiplier signal LOI and quadrature-phase multiplier signal LOQ are 90° out of phase such that the product LOI*LOQ is always 0. In-phase multiplied signal (pwmI1-pwmI2) LOI and quadrature-phase multiplied signal (pwmQ1-pwmQ2) LOQ each take the value of ±1 or 0. As the product LOI*LOQ is always 0, combined switching signal swIQ also takes the value of ±1 or 0. This permits decoder 320 to produce switching signals swA, swB dependent upon the previous state and present state of combined switching signal swIQ, that is decoder 320 acts as a finite state machine FSM. Switching signals swA, swB take the value +1 or 0.

Figure 4:
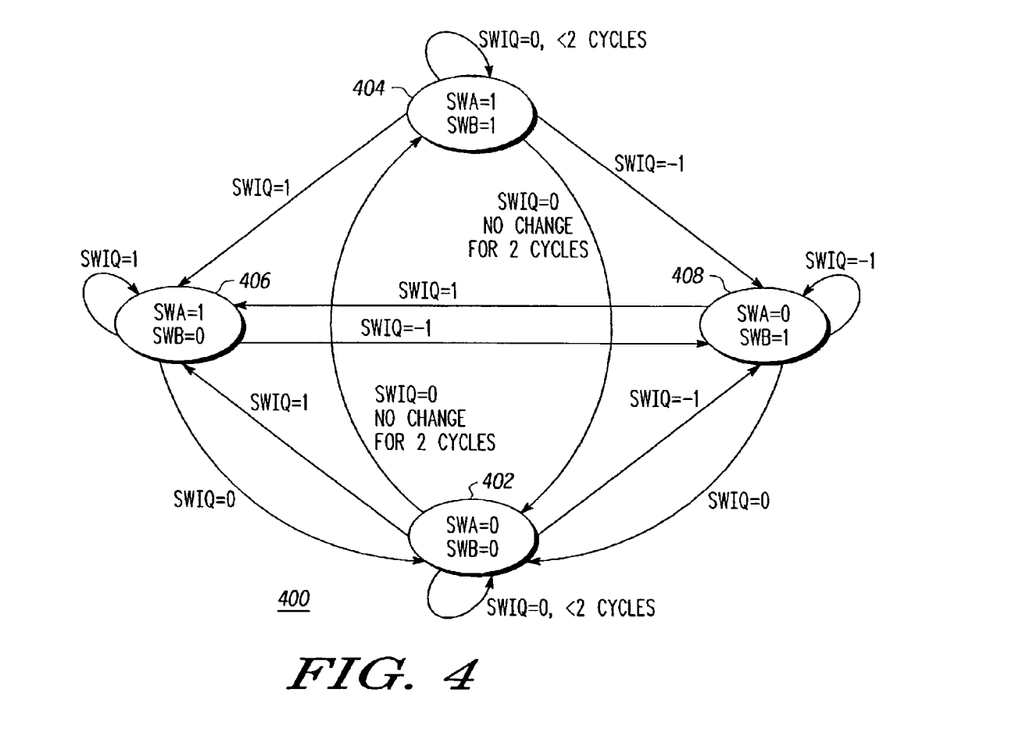
FIG. 4 is one embodiment of a finite state machine for the decoder of FIG. 3.

FIG. 4 shows one such FSM 400 in which combined switching signal swIQ takes the values of ±1 or 0. When switching signals swA, swB are both 0 (state 402), the FSM 400 transitions to state 406 if combined switching signal swIQ=+1. In state 406, switching signal swA becomes 1 while switching signal swB remains 0. When switching signals swA, swB are both 0 (state 402), the FSM 400 transitions to state 408 if combined switching signal swIQ=−1. In state 408, switching signal swB becomes 1 while switching signal swA remains 0. When switching signals swA, swB are both 0 (state 402), the FSM 400 transitions to state 404 if combined switching signal swIQ remains 0 for two cycles. In state 404, switching signals swA, swB both become 1.

In state 404, FSM 400 transitions to state 406 if combined switching signal swIQ=1 and transitions to state 408 if combined switching signal swIQ=−1. When switching signals swA, swB remain in state 404, FSM 400 transitions to state 402 if combined switching signal swIQ remains 0 for two cycles. In state 406, FSM 400 transitions to state 402 when combined switching signal swIQ=0, FSM 400 transitions to state 408 when combined switching signal swIQ=−1 and FSM 400 remains in state 406 when combined switching signal swIQ=1. Similarly, in state 408, FSM 400 transitions to state 402 when combined switching signal swIQ=0, FSM 400 transitions to state 406 when combined switching signal swIQ=+1, and FSM 400 remains in state 408 when combined switching signal swIQ=−1.

As indicated, each of swIQ=+1 and swIQ=−1 maps to one particular state of the FSM 400. However, because swIQ=0 maps to multiple states, when switching signals swA, swB are both 0 or are both 1 and swIQ=0, the state of FSM 400 is switched every two cycles. In other words, finite state machine FSM switches between multiple states (as illustrated, states 402 and 404) if the same mixed signal is supplied to the decoder for a plurality of periods. By forcing the FSM 400 to switch every two cycles under these conditions, a nominal switching rate is maintained.

Figure 5:
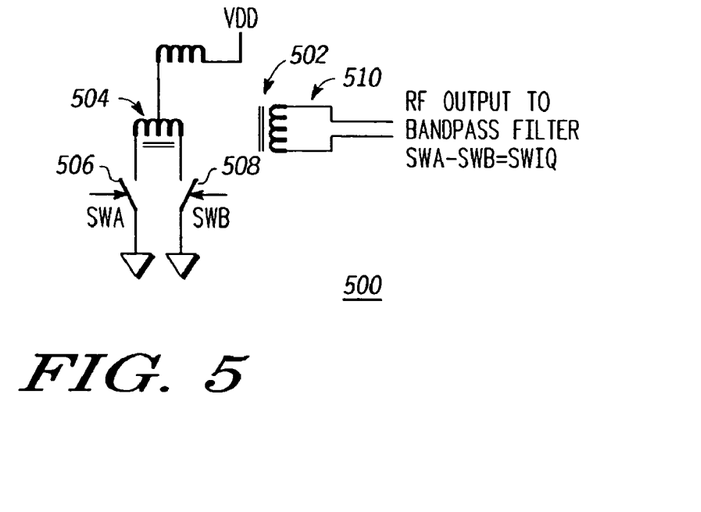
FIG. 5 illustrates an RF switching power stage in accordance with one embodiment.

Alternate embodiments may use other finite state machines. For example, the state in which switching signals swA, swB activates both switches 506, 508 in RF switching power stage 500 (discussed below) may be eliminated to conserve power. Such a FSM may have three states: a state in which both switches are closed, a state in which the first switch is closed and the second switch is open, and a state in which the first switch is open and the second switch is closed.

RF switching power stage 500, shown in FIG. 5 contains a transformer 502 and switches 506, 508. Power supply Vdd is connected to the middle of input coil 504 of transformer 502. The output of the transformer 502 is taken from the output coil 510, which is electromagnetically linked to the input coil 504. Switches 506, 508 are disposed between ends of transformer 502 and ground. RF switching power stage 500 receives switching signals swA, swB, which control switches 506, 508, respectively. For example, when switching signals swA, swB are 1, switches 506, 508 are closed and when switching signals swA, swB are 1, switches 506, 508 are open. When switches 506, 508 are both open, no current flows and thus the output of transformer 502 is 0. When switches 506, 508 are both closed, the currents that flow through opposing sides of input coil 504 of transformer 502 are equal and opposite. Accordingly, when switches 506, 508 are both closed, the output of transformer 502 is again 0. When one of switches 506, 508 is closed and the other of switches 506, 508 is open, the current flowing input coil 504 of transformer 502 provides amplified output signal swIQ dependent on which direction the current flows through input coil 504. For example, when switch 506 is closed and switch 508 is open, output signal swIQ is +1, while when switch 508 is closed and switch 506 is open, output signal swIQ is −1. Thus, output signal swIQ is dependent on switching signals swA, swB such that swIQ=swA-swB.

As illustrated, switches 506, 508 are disposed between the ends of the input coil 504 and ground. However, in another embodiment, switches 506, 508 may be disposed in any arrangement to control the output of power stage 500. For example, switches 506, 508 may be disposed between the ends of the coil and power Vdd. In addition, relating back to FIG. 4, when switches 506, 508 are in the same state and the switching signals swA, swB do not change for a plurality of periods (as indicated, two periods), decoder 320 switches switches 506, 508 to the opposite state at the next period after the plurality of periods. In the alternate embodiment of the FSM, at least one of the switches 506, 508 may be open to conserve power.

As shown in FIG. 1, amplified output signal swIQ is supplied to bandpass filter 126. Bandpass filter 126 filters signals in the spectral range of interest and supplies the filtered signals to load 130. For example, for signals in the RF band (e.g. 900 MHz, 1.9 GHz), the bandpass filter 126 may have a passband with a width of 100-200 MHz.

Figure 7:
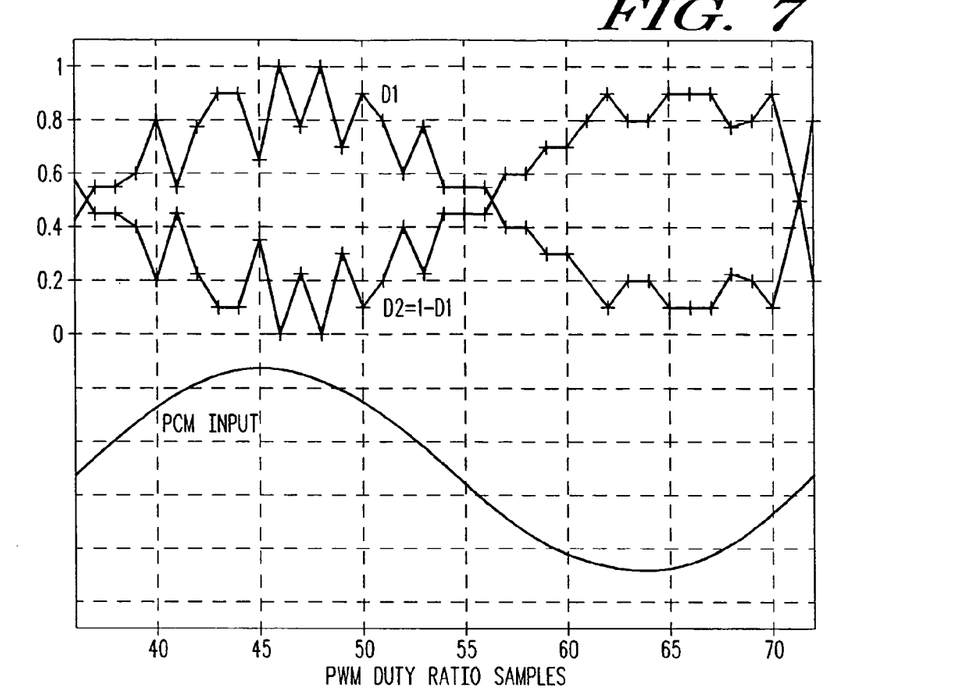
FIG. 7 is an example of a PCM input and corresponding PWM duty ratios in the VFSC PWM generator.
Figure 9:
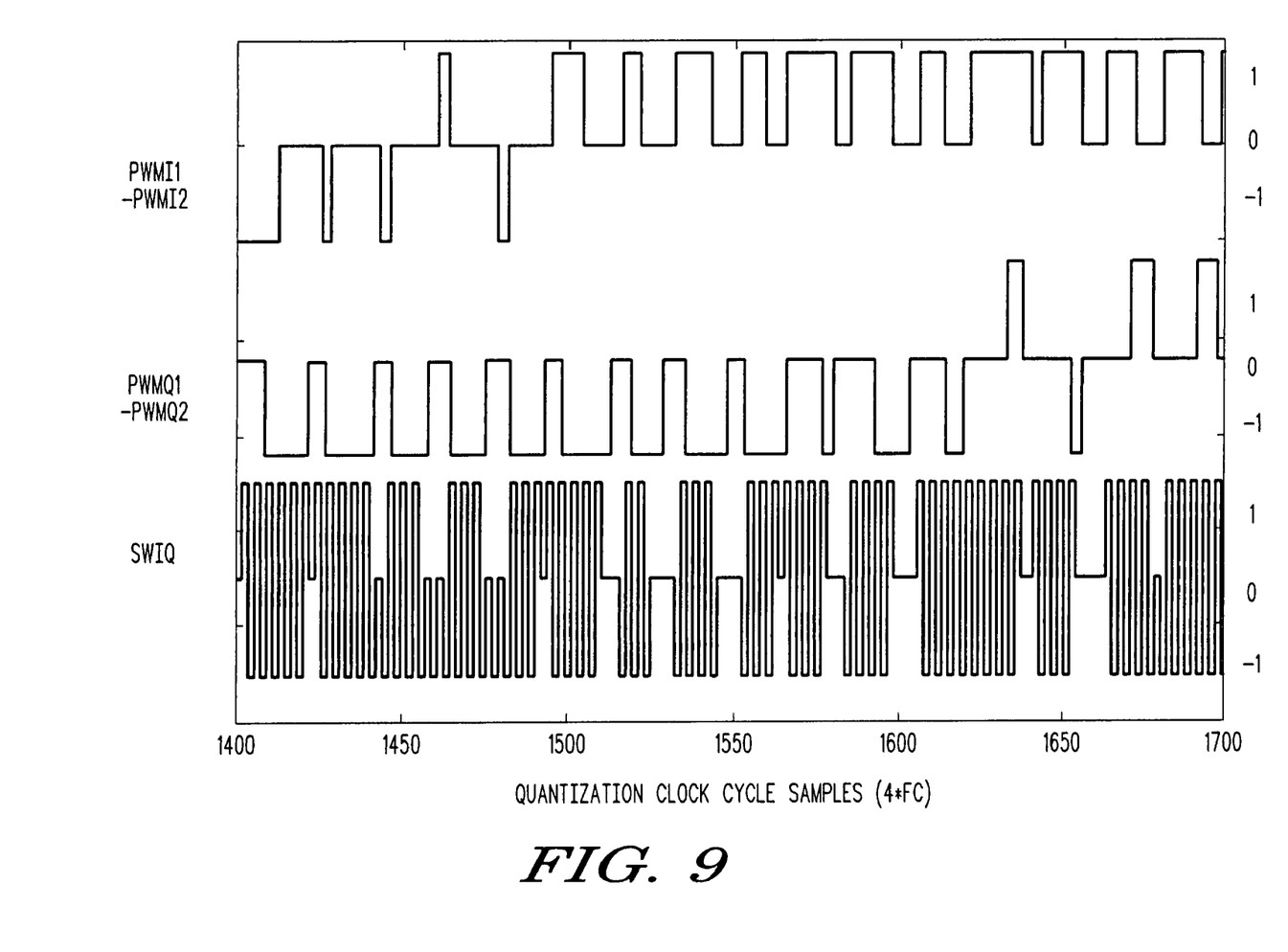
FIG. 9 is an example of input signals to the QMD based on the signals of FIG. 8.
Figure 10:
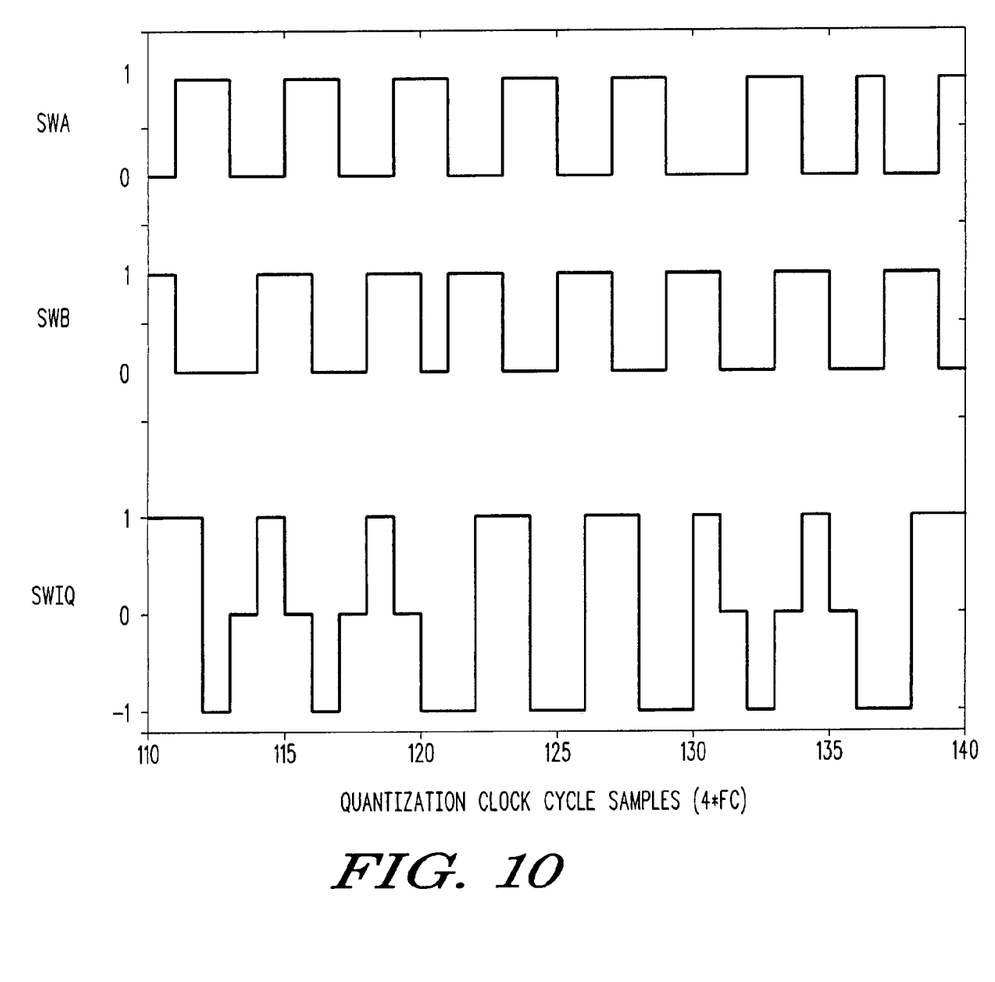
FIG. 10 is an example of output signals from the QMD based on the signals of FIG. 9.

FIGS. 7-10 illustrate simulations of the input and output signals, as well as internal signals in the various elements shown in FIG. 1. More specifically, FIG. 7 shows a PCM input and the corresponding PWM duty ratios D1, D2 in one of the VFSC PWM generators 108. FIG. 8 shows PWM outputs pwmI1, pwmI2 in VFSC PWM generator 108 based on the signals of FIG. 7. FIG. 9 shows the input signals (in-phase and quadrature phase digital PWM signals pwmI1-pwmI2, pwmQ1-pwmQ2) to QMD 116 based on the signals of FIG. 8, as well as combined switching signal swIQ supplied from mixer 310 to decoder 320. FIG. 10 shows output signals (switching signals SwA, SwB) from QMD 116 based on the signals of FIG. 9, as well repeating combined switching signal swIQ for convenience.

Figure 11:
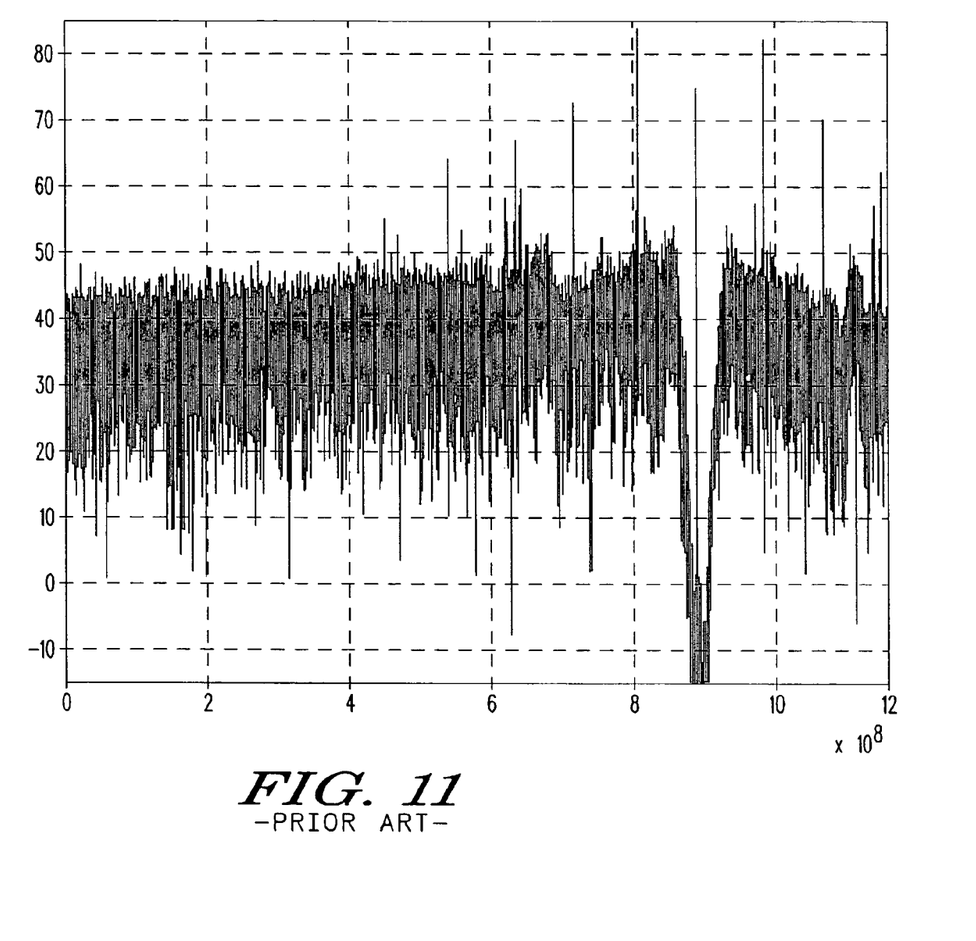
FIG. 11 is an example of an output of a conventional digital amplifier.

FIG. 11 illustrates an example spectrum of an amplified signal of a conventional amplifier. As can be seen, the spectrum contains a frequency band of interest A in which the desired carrier signal B is present. A wide band of noise surrounds the frequency band of interest A and is about 30 dB lower than the signal. However, multiple tones C are present in the noise, some of which are even stronger than the desired carrier signal B in the frequency band of interest A. The tones C closest to the desired carrier signal B are within 100 MHz and are 12-15 dB above the desired carrier signal B. Accordingly, to reduce these tones C, a complicated, large and expensive bandpass filter is used that has a sharp cutoff (<50 MHz) outside the frequency band of interest.

Figure 12:
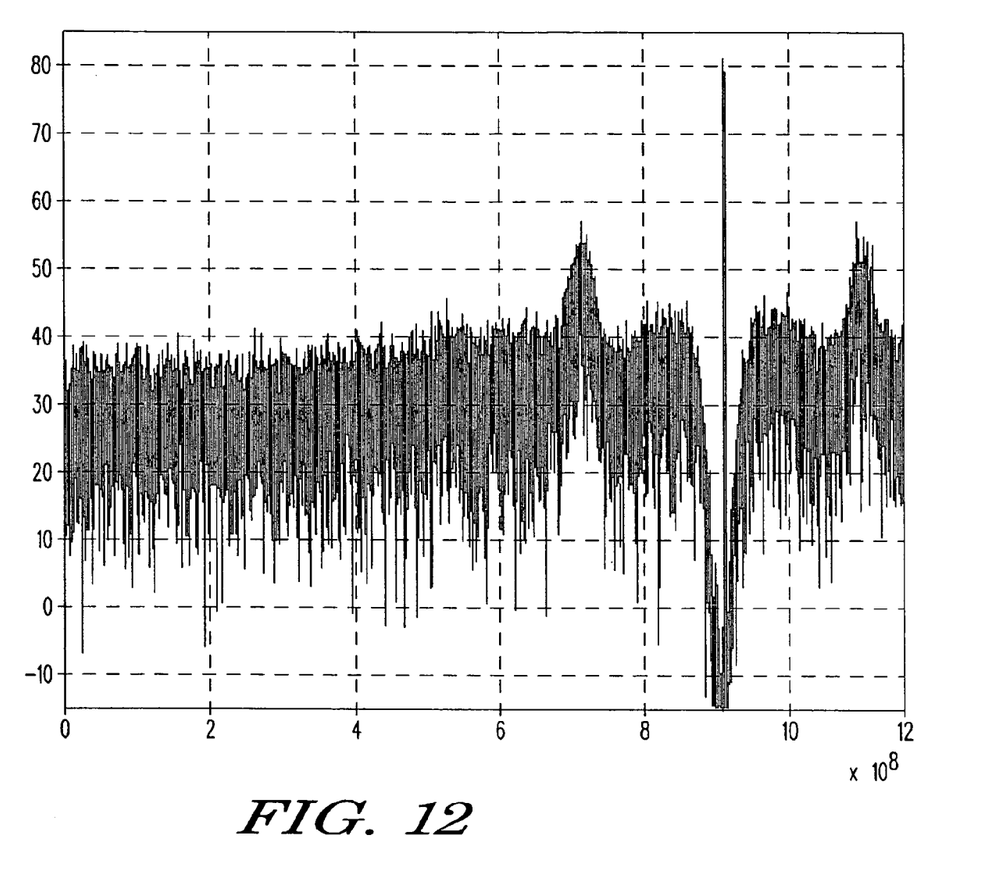
FIG. 12 is an example of an output of the digital amplifier shown in FIG. 1.
Figure 13:
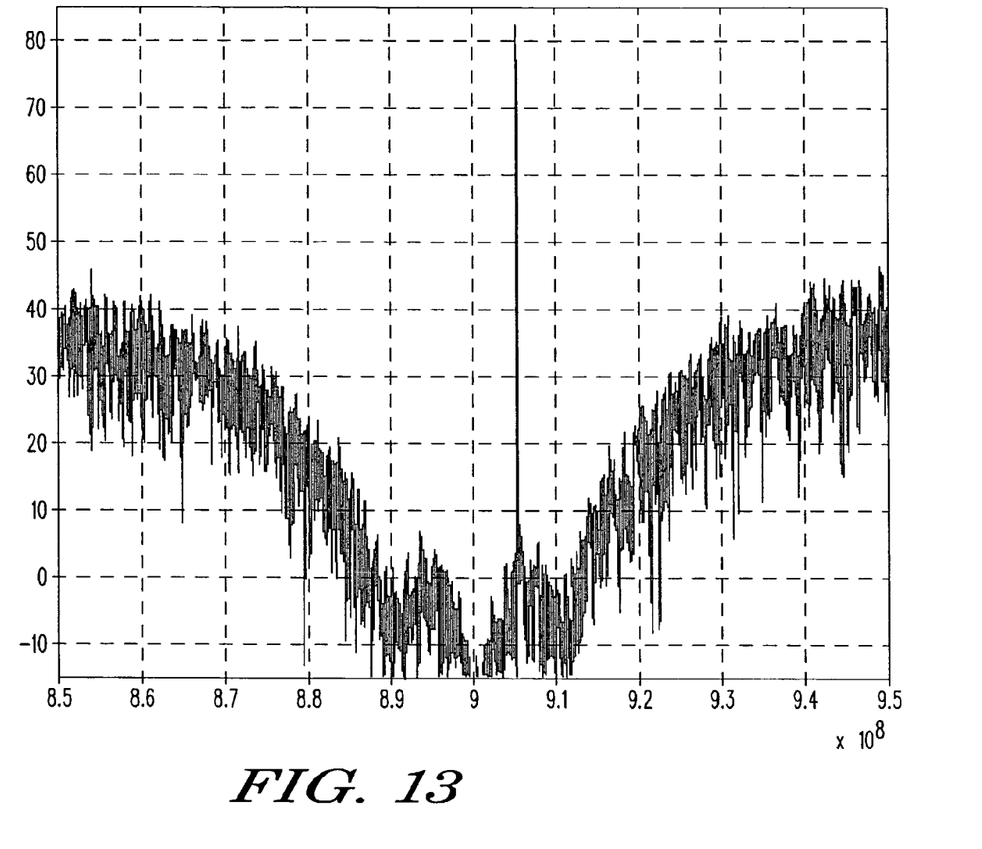
FIG. 13 is the example of FIG. 12 shown in the frequency range of interest.

FIGS. 12 and 13 illustrate a simulated spectrum of an amplified signal of an amplifier according to one embodiment of the present invention. As shown, the spectrum of the switching signal output is much cleaner than that of FIG. 11; the spurious tones have been removed and only the desired signal remains against a backdrop of the wide band of noise. In other words, the quantization noise has been spread all over. There is a small of amount of spurious switching noise at twice the PWM switching frequency (about 200 MHz away). The switching noise about 200 MHz from the carrier signal is 25 dB lower than the carrier signal. This reduces the filtering requirement on the band-pass filter.

Digital amplifiers and methods of converting digital baseband signals to digital signals at a carrier frequency to create a modulated radio frequency (RF) signal has been described. The amplifier includes a power stage that amplifies an RF signal and a signal generator with integral noise shaping that generates the RF signal dependent on a digital input signal and a random period signal. This permits re-distribution of quantization noise of a corrected digital signal input to a band outside the RF band of interest. The signal generator uses the random period signal to reduce electromagnetic interference in the RF signal. More specifically, the RF signal is generated by receiving in-phase and quadrature-phase digital signals, generating in-phase and quadrature-phase differential signals from the in-phase and quadrature-phase digital signals, respectively, using a signal having a random period, mixing the in-phase and quadrature-phase differential signals to produce a mixed signal and producing an amplified RF signal at a carrier frequency dependent on the mixed signal. The mixed signal is decoded and controls switches in the power stage. More specifically, in each signal generator, the input signal and an inverse of the differential signal are summed to produce a summation signal, the summation signal is integrated to produce an error signal, duty ratios are produced in response to the error signal and the signal having the random period, the duty cycle of a signal at the carrier frequency is altered using the duty ratios to produce pulse width modulated signals, and the pulse width modulated signals are subtracted from each other to provide the differential signal. In the mixer, the in-phase and quadrature-phase difference signals are multiplied with in-phase and quadrature-phase multipler signals to produce in-phase and quadrature-phase multiplied signals, respectively, and the in-phase and quadrature-phase multiplied signals are then summed to produce the mixed signal.

In the foregoing specification, the invention has been described with reference to specific embodiments. However, one of ordinary skill in the art appreciates that various modifications and changes can be made without departing from the scope of the present invention as set forth in the claims below. For example, the circuitry may be implemented by field-effect transistors (FETs) such as n-channel FETs or p-channel FETs or bipolar junction transistors (BJTs). Accordingly, the specification and figures are to be regarded in an illustrative rather than a restrictive sense, and all such modifications are intended to be included within the scope of present invention. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

I claim:

1. A digital amplifier comprising:
    a first variable frequency suppressed carrier (VFSC) pulse width modulation (PWM) generator operative to produce an in-phase differential signal dependent on an in-phase signal;
    a second variable frequency suppressed carrier (VFSC) pulse width modulation (PWM) generator operative to produce a quadrature-phase differential signal dependent on an quadrature-phase signal;
    a mixer operative to produce a mixed signal dependent on the in-phase and quadrature-phase differential signals;
    a decoder operative to produce switching signals dependent on the mixed signal; and
    a power stage operative to produce an amplified signal dependent on switching signals from the decoder;
    wherein each of the first and second VFSC PWM generators comprises:
        an integrating error amplifier operable to produce an error signal dependent on an input signal and the differential signal produced by the VFSC PWM generator, the input signal comprising the in-phase signal and the quadrature-phase signal;
        a duty ratio quantizer operable to produce the plurality of duty ratios dependent on the error signal;
        a random period generator operable to provide a variable frequency signal controlling a total number of available pulses of the plurality of duty ratios in each period; and
        a pulse width modulation counter operable to produce a plurality of pulse width modulated signals dependent on the duty ratios, wherein the differential signal produced by the VFSC PWM generator is based on the plurality of pulse width modulated signals.

2. The digital amplifier of claim 1, wherein the digital amplifier is operable to convert base-band signals to switching waveforms switching at a carrier frequency to create a modulated radio frequency (RF) signal.

3. The digital amplifier of claim 1, wherein the mixer comprises:
    a first multiplier operable to multiply the in-phase differential signal and an in-phase multiplier signal to produce an in-phase multiplied signal,
    a second multiplier operable to multiply the quadrature-phase differential signal and a quadrature-phase multiplier signal to produce a quadrature-phase multiplied signal, and
    a summation unit operable to sum the in-phase and quadrature-phase multiplied signals to produce the mixed signal.

4. The digital amplifier of claim 1, wherein the decoder comprises a finite state machine.

5. The digital amplifier of claim 4, wherein a particular mixed signal corresponds to multiple states of the finite state machine.

6. The digital amplifier of claim 5, wherein the finite state machine switches between the multiple states if the particular mixed signal is supplied to the decoder for a plurality of periods.

7. The digital amplifier of claim 1, wherein the power stage comprises a transformer having an input coil in which ends of the input coil are connected to switches controlled by the switching signals.

8. The digital amplifier of claim 7, wherein when the switches are in a same state and the switching signals do not change for a plurality of periods, the decoder switches the switches to an opposite state at a next period after the plurality of periods.

9. The digital amplifier of claim 7, wherein at least one of the switches is open each period.

10. The digital amplifier of claim 1, wherein:
    each of the first and second VFSC PWM generators further comprises:

a first summation unit operable to sum the input signal and an inverse of the differential signal supplied by the VFSC PWM generator to produce a summation signal; and a second summation unit operable to produce the differential signal supplied by the VFSC PWM generator dependent on the pulse width modulated signals; and the integrating error amplifier is further operable to produce the error signal dependent on the summation signal.

11. The digital amplifier of claim 10, wherein the duty ratio quantizer provides a pair of complementary duty ratios.

12. A digital amplifier comprising:

a variable frequency suppressed carrier pulse width modulation (VFSC PWM) generator with integral noise shaping for generating a radio-frequency (RF) digital PWM signal, the VFSC PWM generator responsive to a digital signal input and a random period signal for re-distributing a quantization noise of a corrected digital signal input to a band outside an RF band of interest in generating the RF digital PWM signal, the VFSC PWM generator comprising:

an integrating error amplifier operable to produce an error signal dependent on the digital signal input and a differential signal produced by the VFSC PWM generator;

a duty ratio quantizer operable to produce a plurality of duty ratios dependent on the error signal; and a pulse width modulation counter operable to produce a plurality of pulse width modulated signals dependent on the duty ratios, wherein the differential signal is based on the plurality of pulse width modulated signals; and a power stage operable to provide an amplified RF digital PWM signal dependent on the RF digital PWM signal.

13. The digital amplifier of claim 12, wherein the VFSC PWM signal generator uses the random period signal to reduce electromagnetic interference in the RF digital PWM signal.

14. The digital amplifier of claim 12, wherein the VFSC PWM generator uses the integral noise shaping to reduce an amount of noise caused by quantization of the corrected digital signal in the generating of the RF digital PWM signal.

15. The digital amplifier of claim 12, further comprising another VFSC PCM generator, wherein in-phase and quadrature-phase modulation signals are received by the VFSC PCM generators and output in-phase and quadrature-phase signals from the VFSC PWM generators are combined to generate the RF digital PWM signal.

16. The digital amplifier of claim 12, wherein:

the VFSC PWM generator further comprises:

a first summation unit operable to sum the digital signal input and an inverse of the differential signal produced by the VFSC PWM generator to produce a summation signal; and a second summation unit operable to produce the differential signal dependent on the pulse width modulated signals; and the integrating error amplifier is further operable to produce the error signal dependent on the summation signal.

17. The digital amplifier of claim 16, wherein each of the first and second VFSC PWM generators comprise a random period generator that provide a variable frequency signal controlling a total number of available pulses of each of the duty ratios in each period.

18. A method of generating an RF signal with a digital circuit, the method comprising:

generating in-phase and quadrature-phase differential signals with the digital circuit from in-phase and quadrature-phase digital signals, respectively, using a signal having a random period which controls a total number of available pulses of a plurality of duty ratios in each period of the signal, comprising:

integrating the digital signal and inverse of the differential signal to produce an integrated signal;

producing the plurality of duty ratios dependent on the integrated signal and the signal having the random period;

producing a plurality of pulse width modulated signals by altering a duty cycle of a signal at the carrier frequency using the duty ratios, wherein the differential signal is based on the plurality of pulse width modulated signals; and mixing the in-phase and quadrature-phase differential signals with the digital circuit; and producing an amplified RF signal with the digital circuit at a carrier frequency dependent on the mixed in-phase and quadrature-phase differential signals.

19. The method of claim 18, further comprising decoding the mixed signal to control switches in a power stage that produces the amplified RF signal.

20. The method of claim 19, wherein mixing the in-phase and quadrature-phase differential signals comprises:

multiplying the in-phase and quadrature-phase differential signals with in-phase and quadrature-phase multiplier signals, respectively; and summing in-phase and quadrature-phase multiplied signals.

21. The method of claim 19, further comprising controlling the switches such that when the switches are in a same state and the mixed signal does not change for a plurality of periods, the decoder switches the switches to an opposite state at a next period after the plurality of periods.

22. The method of claim 20, wherein:

generating each of the differential signals further comprises:

summing the digital signal and an inverse of the differential signal to produce a summed input signal; and subtracting the pulse width modulated signals to provide the differential signal; and integrating comprises integrating the summed input signal and the inverse of the differential signal to produce the integrated signal.

23. The method of claim 22, further comprising setting the duty ratios to be complementary to each other.

* * * * *

UNITED STATES PATENT AND TRADEMARK OFFICE
CERTIFICATE OF CORRECTION

PATENT NO.        : 7,649,961 B2                                    Page 1 of 1
APPLICATION NO.   : 11/156396
DATED             : January 19, 2010
INVENTOR(S)       : Pallab Midya It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1182 days.

Signed and Sealed this

Twenty-third Day of November, 2010

David J. Kappos
*Director of the United States Patent and Trademark Office*